United States Patent [19]

Olmstead

[11] Patent Number: 4,695,922

[45] Date of Patent: Sep. 22, 1987

[54] CONSTANT RATIO, SIZE INSENSITIVE, CAPACITOR STRUCTURE

[75] Inventor: John A. Olmstead, Branchburgh Township, Sumerset County, N.J.

[73] Assignee: RCA Corporation, Princeton, N.J.

[21] Appl. No.: 925,982

[22] Filed: Nov. 3, 1986

[51] Int. Cl.$^4$ .............................................. H01G 4/38
[52] U.S. Cl. .................................................... 361/329
[58] Field of Search ............... 29/571, 577 C; 357/51, 357/54; 361/328, 329, 330

[56] References Cited

U.S. PATENT DOCUMENTS

| 3,368,116 | 2/1968 | Spaude | 317/101 |
| 4,210,950 | 7/1980 | Fraser et al. | 361/329 |
| 4,571,816 | 2/1986 | Dingwall | 29/571 |

FOREIGN PATENT DOCUMENTS

| 211197 | 7/1984 | German Democratic Rep. | 361/329 |

OTHER PUBLICATIONS

J. L. McGreary et al., "All-MOS Redistribution Analog-to-Digital Conversion Techniques—Part 1", *IEEE Journal of Solid-State Circuits*, vol. SC-10, pp. 371-379, Dec. 1975.

D. J. Allstot et al., "Technological Design Considerations for Monolithic MOS Switched-Capacitor Filtering Systems", *Proceedings of the IEEE*, vol. 71, No. 8, pp. 967-986, Aug. 1983.

*Primary Examiner*—Donald A. Griffin
*Attorney, Agent, or Firm*—S. S. Corwin; B. E. Morris

[57] ABSTRACT

The present invention involves a geometric structure for a pair of matched capacitors for use in an integrated circuit device. Each of the matched capacitors are composed of at least one of a unit capacitor and one or more subcapacitors arranged in abutting relationship. Each subcapacitor includes a tab projecting outwardly and an opening of similar size projecting inwardly. The tab is arranged to abut against the side of a unit capacitor or another subcapacitor. The tabs and openings are sized so that the area to peripheral length ratios of the matched capacitors are identical.

6 Claims, 10 Drawing Figures

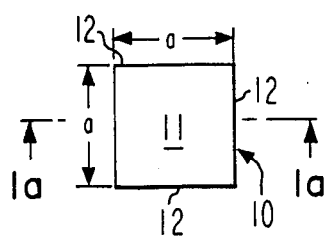
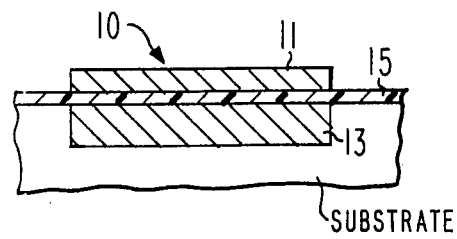
Fig. 1     Fig. 1a
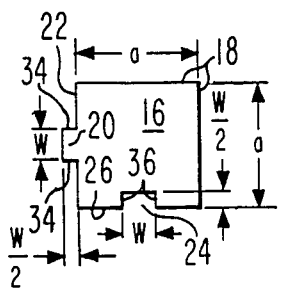
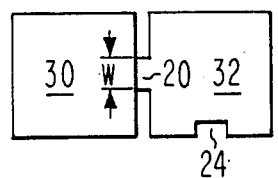
Fig. 2     Fig. 3
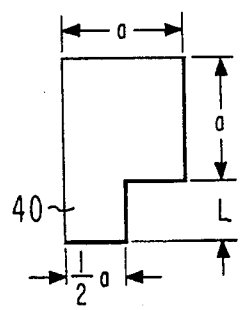
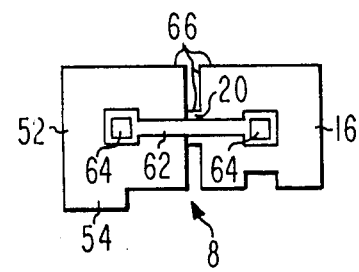
Fig. 4     Fig. 6
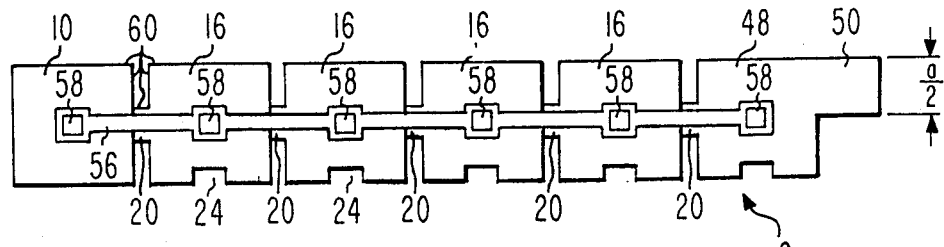
Fig. 5

CONSTANT RATIO, SIZE INSENSITIVE, CAPACITOR STRUCTURE

The present invention relates to capacitor structures for integrated circuit devices which permit the capacitive ratio of matched capacitors to be size insensitive and minimize interconnect parasitic capacitance.

BACKGROUND OF THE INVENTION

Switch capacitor filters, capacitor D to A and A to D converters, and capacitor controlled gain stages which are in common use today require precise ratio matched capacitors. The difficulty of making such ratio matched capacitors with current MOS integrated circuit technology is well known. One of the primary difficulties encountered, which is the subject of the present invention, is the change in ratio of matched capacitors due to the effects of over or under exposure during photoresist processing or to over or under etching of the individual capacitor plates. Both of these effects can substantially vary the capacitive ratio of these matched capacitors from their nominal design values.

One method of substantially reducing these effects is to arrange the capacitor geometry so that the ratios of the respective capacitor areas to periphery lengths are equal. While this method is effective, it requires considerable skill on the part of the designer to lay out this geometry. Trial and error techniques are frequently employed with mixed results. Another method of reducing these effects is through the use of so called "unit capacitors". The theory is that each of the matched capacitors is composed of a number of identical unit capacitors which are equally affected by over or under exposure of the photoresist, or to over or under etching. Therefore, each of the matched capacitors will be affected in proportion to the number of unit capacitors contained therein thereby retaining a fixed ratio of capacitance between the matched capacitors. Examples of the use of such unit capacitors may be found in J. L. McGreary et al., *IEEE J*, Solid-State Circuits, Part 1, Vol. SC-10, pp. 371-379, Dec. 1975 and in D. L. Allstat et al., *Proceedings IEEE*, Technological Design Considerations for Monolithic MOS Switched-Capacitor Filtering Systems, Vol. 71, No. 8, pp. 967-986, Aug. 1983.

Needless to say, the identical unit capacitors must be interconnected in parallel by some means, usually a metal conductor which is formed on the surface of the device. Substantial parasitic capacitances occur where the metal conductors cross the spaces between the unit capacitor elements. Where the conductor is on the same level as the capacitor plates, which is usually the case when the top plates are metal, the effect on the matched capacitor ratio can be on the order of 0.98 percent. Even where an extra thick oxide layer is used to raise the level of the conductor above the substrate, the effect on the matched capacitor ratio can be as high as 0.14 percent. Both of these are intolerable amounts in certain circuit applications.

Another source of error in the capacitance ratio stems from the need to account for a non-integer amount of capacitance when using the unit capacitors. The usual procedure is to simply increase or reduce the size of one of the unit capacitors. This in turn causes an error in the area to periphery ratio of the capacitor which, as described above, can result in an error in the matched capacitor ratio.

What is needed is an easily utilized geometry for matched capacitors which eliminates parasitic capacitance due to unit capacitor interconnect conductors and which permits non-integer amounts of capacitance while maintaining a desired capacitor area to periphery ratio.

SUMMARY OF THE INVENTION

The present invention includes an integrated circuit device having a pair of matched capacitors each of which comprises at least one of a unit capacitor and a first subcapacitor. The first subcapacitor includes a rectangularly shaped tab having a width W. The tab projects outwardly from a side of the subcapacitor for a distance substantially equal to one half W. A rectangularly shaped opening is provided in another side of the subcapacitor having a width that is substantially equal to W and that extends inwardly from the side for a distance substantially equal to one half W. The unit capacitor abuts the tab of the subcapacitor along the tab's entire length W.

BRIEF DESCRIPTION OF THE DRAWINGS

FIG. 1 is a plan view showing the top plate of a unit capacitor in accordance with the teachings of the present invention;

FIG. 1a is a cross-sectional view taken along the lines 1a—1a in FIG. 1;

FIG. 2 is a plan view showing the top plate of a subcapacitor in accordance with the teachings of the present invention;

FIG. 3 is an arrangement of the unit capacitor and subcapacitor of FIGS. 1 and 2;

FIG 4 is a variation of the unit capacitor of FIG. 1;

FIGS. 5 and 6 are plan views showing typical capacitors in accordance with the teachings of the present invention.

DESCRIPTION OF THE PREFERRED EMBODIMENT

Figure 7:
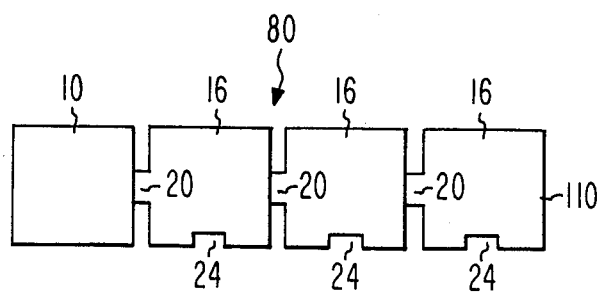
FIGS. 7, 8 and 9 illustrate the affect on capacitor area due to a plate size increase over a nominal design value.

The FIGS. 1 through 9 schematically represent variations of a unit capacitor and subcapacitors, in accordance with the teachings of the present invention. All views are plan views showing only the top plate of the capacitors in their outline form and, in the case of FIGS. 5 and 6, interconnecting conductors.

A unit capacitor 10 is shown in FIG. 1 as substantially square and having four sides 12 of substantially equal length. The length a of the sides 12 is chosen to provide a convenient area $a^2$ which is equal to or smaller than that needed for the smaller of the two matched capacitors. While the unit capacitor 10 and subcapacitor 16, in the present example, are substantially square other suitable shapes may be employed within the scope of the present invention. The cross section of the unit capacitor 10 is shown in FIG. 1a having a top plate 11, a bottom plate 13, and a layer 15 of dielectric material therebetween. The top and bottom plates 11 and 13 may be of metal, doped silicon, or any suitable conductive material, while the layer 15 is an insulator such as silicon oxide or some other suitable dielectric.

A subcapacitor 16 is shown in FIG. 2 having a generally square shape and sides 18 of length a. A tab 20 having a width W, as shown in FIG. 2, projects outwardly from the side 22 for a distance substantially equal to one half W. An opening 24 is formed in a side 26 and has a width substantially equal to W and a depth substantially equal to one half W. The tab 20 and opening 24 are substantially rectangular. The subcapacitor 16 in cross section is similar to the unit capacitor 10 in that it includes top and bottom plates separated by a layer of dielectric material. The tab 20 and opening 24, in the present example, are formed in the top and bottom plates 11 and 13 respectively, however, the invention may be practiced by forming them in only the top plate.

As shown in FIG. 3, a capacitor having a plate area of two times the area of the unit capacitor may be formed by simply abutting a unit capacitor 30 and a subcapacitor 32. As explained in Background of the Invention above, it is desirable to maintain the area to peripheral length (A/P) ratio equal to a constant value. Note that when the unit capacitor 30 and subcapacitor 32 are abutted, as shown in FIG. 3, a portion of the peripheral length equal to W is lost from the unit capacitor 30 and the same amount is lost from the subcapacitor 32. That is, a total of 2W is lost from the peripheral length of the combined unit capacitor 30 and subcapacitor 32. However, it will be noted that the peripheral length of the subcapacitor 16, as shown in FIG. 2, is greater than the peripheral length of the unit capacitor 10 of FIG. 1, by an amount equal to the sum of the two sides 34 of the tab 20 and the two sides 36 of the opening 24. This sum is equal to 2W which exactly equals the loss in peripheral length occurring when abutting the two capacitors 30 and 32, as shown in FIG. 3.

Obviously, it is unlikely that a capacitor having a desired capacitance would be an integer multiple of the unit capacitor 10. Any fractional amount that is needed may be provided by means of a projection 40 which projects from a side of the unit capacitor, as shown in FIG. 4, or a projection 50 which projects from a side of the subcapacitor, as shown in FIG. 5. In order to maintain the established A/P ratio, the width of the projection must be substantially equal to one half the length of the side, or simply a/2. To understand this, one needs only to recognize that the A/P ratio of the unit capacitor shown in FIG. 1 and having sides of length a, equals $a^2/4a$ or $a/4$, and the A/P ratio of the same size unit capacitor shown in FIG. 4 and having the projection 40 equals $(a^2 + \frac{1}{2} La)/(4a+2L)$ which reduces to $a/4$. Therefore, the length L of the projection 40 may be adjusted to provide any desired area without altering the A/P ratio of the capacitor.

FIGS. 5 and 6 depict a typical pair of matched capacitors 6 and 8 respectively which reflect the teachings of the present invention. The capacitance $C_1$ of the capacitor 6 is, in this example, exactly three times the capacitance $C_2$ of the capacitor 8. That is, $C_1/C_2 = 3$. The capacitor 6 consists of a unit capacitor 10, four subcapacitors 16, and a final subcapacitor 48 having a projection 50 but that is otherwise identical to the subcapacitors 16. A conductor 56, which in the present example is metal, is disposed on the unit capacitor 10 and subcapacitors 16 and 48 and is in ohmic contact therewith at the contacts 58, as shown in FIG. 5. Note that the conductor 56 crosses from one subcapacitor to the other exclusively over the regions where the tabs 20 abut their respective adjacent subcapacitor or unit capacitor. The conductor 56 is not permitted to extend beyond the perimeter 60 of the capacitor 6, as shown in FIG. 5. The capacitor 8 shown in FIG. 6 consists of a unit capacitor 52 having a projection 54 and a single subcapacitor 16. Except for the projection 54, the unit capacitor is of the same size and shape as the unit capacitor 10. A conductor 62, similar to the conductor 56, is disposed on the unit capacitor 52 and the subcapacitor 16 and is in ohmic contact therewith at the contacts 64, as shown in FIG. 6. As with the conductor 56, the conductor 62 is routed over the region where the tab 20 abuts the unit capacitor 52 and is not permitted to extend beyond the perimeter 66 of the capacitor 8.

Figure 8:
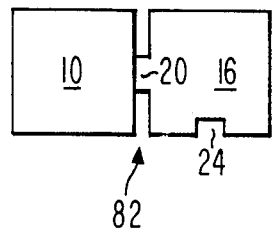

FIGS. 7 and 8 show a pair of matched capacitors 80 and 82 respectively, having identical A/P ratios and having capacitances $C_1$ and $C_2$ respectively. The following discussion illustrates how the capacitors 80 and 82 may undergo a substantial deviation in their nominal design size without substantially affecting their nominal design capacitive ratio $C_1/C_2$. For purposes of this example, the nominal design size for the unit capacitors 10 and the subcapacitors 16 are assumed to be 50 microns square. In addition, the tabs 20 of the subcapacitors 16 have a nominal width of 10 microns and project outwardly from their respective subcapacitors for a distance of 5 microns. The openings 24 in the subcapacitors 16 have a nominal width of 10 microns and a depth of 5 microns. Both the tabs 20 and the openings 24 are rectangular. This structure results in a capacitor plate area of 2500 square microns for each of the unit capacitors 10 and each of the subcapacitors 16 giving a total area of 10,000 square microns for the matched capacitor 80 of FIG. 7 and a total area of 5,000 square microns for the matched capacitor 82 of FIG. 8. This provides a capacitive ratio of $C_1/C_2 = 2$ since capacitance is directly proportional to plate area. The peripheries of the two capacitors 80 and 82, given the assumed dimensions, are 800 microns and 400 microns respectively. This yields an A/P ratio for the capacitor 80 of 10,000/800 and for the capacitor 82 of 5,000/400.

Figure 9:
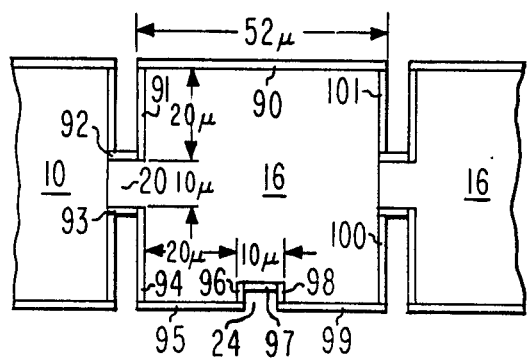

Since the A/P ratio of the two capacitors 80 and 82 are identical, their capacitive ratio of $C_1/C_2$ will remain substantially the same independent of variations in the sizes of the unit capacitor 10 and the subcapacitors 16 due to over or under exposure of photo masks or over or under etching of the plates. FIG. 9 illustrates a portion of the capacitor shown in FIG. 7 with the addition of a one micron size increase in all directions as might result if the plates were under etched by an appropriate amount. Note that the area increase to the subcapacitor 16 can be determined by summing the individual areas 90 through 101 shown in FIG. 9. Their respective areas will be found by inspection to be: 52, 20, 4, 4, 20, 22, 5, 8, 5, 22, 19, and 19 square microns for a total increase in area of 200 square microns. This increase in area will be the same for each subcapacitor 16 except the right most one, as viewed in FIG. 7, which will include an additional area of 12 square microns due to the lack of a tab 20 abutting the side 110. Similarly by inspection, the increase in area of the unit capacitor 10 will be found to be 52, 50, 52, 19, and 19 square microns for a total increase in area of 192 square microns. Therefore, the total increase for the capacitor 80 is 192+200+200+212 for a total of 804 square microns resulting in a total area for the capacitor 80 of 10,804 square microns.

Similarly the total increase for the capacitor 82 is 192 and 212 for a total of 404 square microns resulting in a total area for the capacitor 82 of 5,404 square microns. The capacitive ratio of the two capacitors is equal to 10,804/5,404 which equals 1.99926. This is a 0.037 percent change in the capacitive ratio of the two capacitors 80 and 82 which is substantially improved over that expected using prior art techniques which typically result in a greater than 0.1 percent change. Further, because the conductors which interconnect the unit capacitors with the subcapacitors are confined to within the periphery of the capacitors, there are no parasitic capacitances resulting by virtue of the presence of these conductors.

I claim:

1. In an integrated circuit device, a pair of matched capacitors each of which comprises at least one of a unit capacitor and a first subcapacitor having a top plate, a bottom plate, and a layer of dielectric material therebetween, wherein at least said top plate of said first subcapacitor includes a rectangularly shaped tab having a width W, said tab projecting outwardly from a side of said subcapacitor for a distance substantially equal to one half W, and a rectangularly shaped opening in a side of said subcapacitor having a width substantially equal to W and extending inwardly from said side for a distance substantially equal to one half W, wherein said unit capacitor abuts said tab along its entire width W.

2. The device set forth in claim 1 wherein said unit capacitor and said first subcapacitor are of generally square shape and have substantially equal areas.

3. The device set forth in claim 2 including one or more additional subcapacitors each having substantially the same size and shape as said first subcapacitor and arranged in abutting relationship so that the tab of each subcapacitor abuts a side of a different one of said additional subcapacitors and wherein the tab of one of said additional subcapacitors abuts a side of said first subcapacitor.

4. The device set forth in claim 3 wherein one of said unit capacitor and said subcapacitors includes a rectangular portion projecting outwardly from a side thereof having a width which is substantially equal to one half the length of said side.

5. The device set forth in claim 4 including a conductor means electrically interconnecting said unit capacitor and said subcapacitors in parallel, comprising a layer of conductive material contacting each of, and extending over only a portion of said unit capacitor and a portion of each of said subcapacitors.

6. The device set forth in claim 3 including a conductor means electrically interconnecting said unit capacitor and said subcapacitors in parallel, comprising a layer of conductive material contacting each of, and extending over only a portion of said unit capacitor and a portion of each of said subcapacitors.

* * * * *